United States Patent
Chen et al.

(10) Patent No.: US 12,317,442 B2
(45) Date of Patent: May 27, 2025

(54) LOCKING BRACKET AND CHASIS

(71) Applicant: Fulian Precision Electronics (Tianjin) Co., LTD., Tianjin (CN)

(72) Inventors: Hung-Wei Chen, New Taipei (TW); Yu-Yong Huang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 59 days.

(21) Appl. No.: 18/380,595

(22) Filed: Oct. 16, 2023

(65) Prior Publication Data
US 2024/0389255 A1    Nov. 21, 2024

(30) Foreign Application Priority Data
May 15, 2023  (CN) .......................... 202310544598.X (51) Int. Cl.
*H05K 7/14*   (2006.01)
(52) U.S. Cl.
CPC ................................. *H05K 7/1404* (2013.01)
(58) Field of Classification Search
CPC ..................................................... H05K 7/1404
USPC ........................................................ 361/801
See application file for complete search history.

(56) References Cited

U.S. PATENT DOCUMENTS

| | | | | |
|---|---|---|---|---|
| 2005/0152106 A1* | 7/2005 | Coster | .................. | H05K 5/0221 361/679.58 |
| 2009/0034186 A1* | 2/2009 | Mau | ....................... | G06F 1/186 361/679.41 |
| 2010/0203750 A1* | 8/2010 | Boetzer | .................. | G06F 1/183 439/159 |
| 2013/0301209 A1* | 11/2013 | Zhou | ....................... | G06F 1/186 361/679.32 |
| 2016/0085275 A1* | 3/2016 | Chen | ....................... | G06F 1/186 361/679.58 |
| 2019/0037733 A1* | 1/2019 | Ehlen | .................... | H05K 5/0213 |
| 2019/0075667 A1* | 3/2019 | Ehlen | .................... | H05K 5/0221 |

FOREIGN PATENT DOCUMENTS

| | | |
|---|---|---|
| TW | M325529 U | 1/2008 |
| TW | 201347654 A | 11/2013 |
| TW | I509390 B | 11/2015 |

* cited by examiner

*Primary Examiner* — Zhengfu J Feng
(74) *Attorney, Agent, or Firm* — ScienBiziP, P.C.

(57) ABSTRACT

Disclosed in the present disclosure is a locking bracket and a chassis. The locking bracket includes a locking base and a locking block. The locking base is fixedly connected to the chassis, and the locking block is movably connected to the locking base along a preset path to switch the locking block to the locked state when installing the functional module into the chassis. The clamping groove can clamp the limiting portion of the installing bracket that covers and fixes the functional module to fix its position, thereby improving the problem of component detachment caused by vibration, shaking, or impact during transportation of the chassis. When it is necessary to remove the functional module from the chassis, the locking block is moved along the preset path to switch from the locked state to the unlocked state.

18 Claims, 8 Drawing Sheets

LOCKING BRACKET AND CHASIS

FIELD

The present disclosure relates to the technical field of server structure, and in particular to a locking bracket and chassis.

BACKGROUND

In the structural design of the chassis, the chassis is usually designed with a clamping structure to improve the problem of components falling off due to vibration, shaking or impact during transportation. Therefore, each functional module is usually locked to the chassis with a corresponding structure to keep the components securely attached.

In the related art, an outer peripheral surface of the functional module is wrapped and secured by a mounting bracket, and a locking bracket is secured to a side wall of the chassis, and the functional module is secured by snugging and locking two limiting portions at the end of the mounting bracket in a limiting slot of the locking bracket. Due to the tight gap between the limiting section of the mounting bracket and the limiting slot of the locking bracket, in the process of assembling the functional module in a straight up and down manner, if the operator is unable to ensure a horizontal movement, the angular deviation is likely to lead to the phenomenon that the limit section of the mounting bracket and the limiting slot of the locking bracket produce a stuck phenomenon, which results in the disassembling and assembling of the functional module being unsuccessful, increases the operation time, and causes the mounting bracket and the fixing bracket to produce the risk of deformation.

Therefore, improvement is desired.

BRIEF DESCRIPTION OF THE DRAWINGS

DISCLOSURE

DETAILED DESCRIPTION

The technical solutions in the embodiments of the present disclosure will be described below in conjunction with the accompanying drawings in the embodiments of the present disclosure, and it is clear that the embodiments described are only a portion of the embodiments of the present disclosure and not all of them.

It should be noted that when an element is considered to be "connected" to another element, it may be directly connected to the other element or there may be both centered elements. When an element is considered to be "disposed on" another element, it may be disposed directly on the other element or there may be both centered elements.

In the description of the embodiments of the present disclosure, the technical terms "first", "second" and the like are only used to distinguish different objects, and are not to be construed as indicating or implying relative importance, or implicitly specifying the number, specific order, or primary-secondary relationship of the indicated technical features. In the description of the embodiments of the present disclosure, "more than one" means more than two, unless otherwise expressly and specifically limited.

In the present disclosure, unless otherwise expressly provided and limited, the terms "connection," "fixing" and the like shall be broadly construed, for example, the fixing connection may be snap-fit fixing, bolt-fit fixing or one-piece molding and the like. To a person of ordinary skill in the art, the specific meaning of the above terms in the present disclosure may be understood according to the specific circumstances.

Embodiments of the present disclosure are further described below in conjunction with the accompanying drawings.

Embodiment 1

Figure 1:
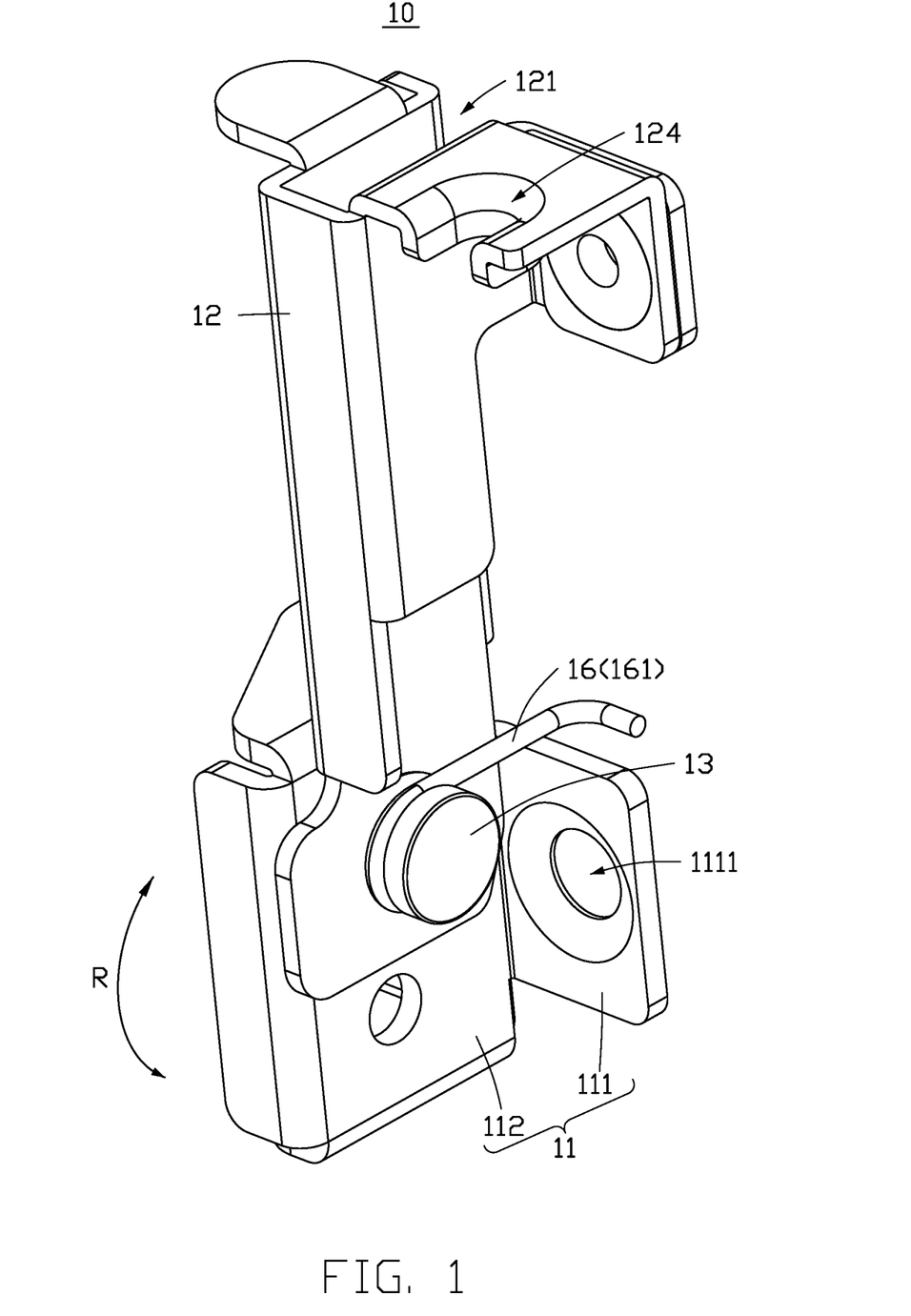
FIG. 1 is a schematic diagram of a locking bracket in a locked state according to a first embodiment of the present disclosure.
Figure 2:
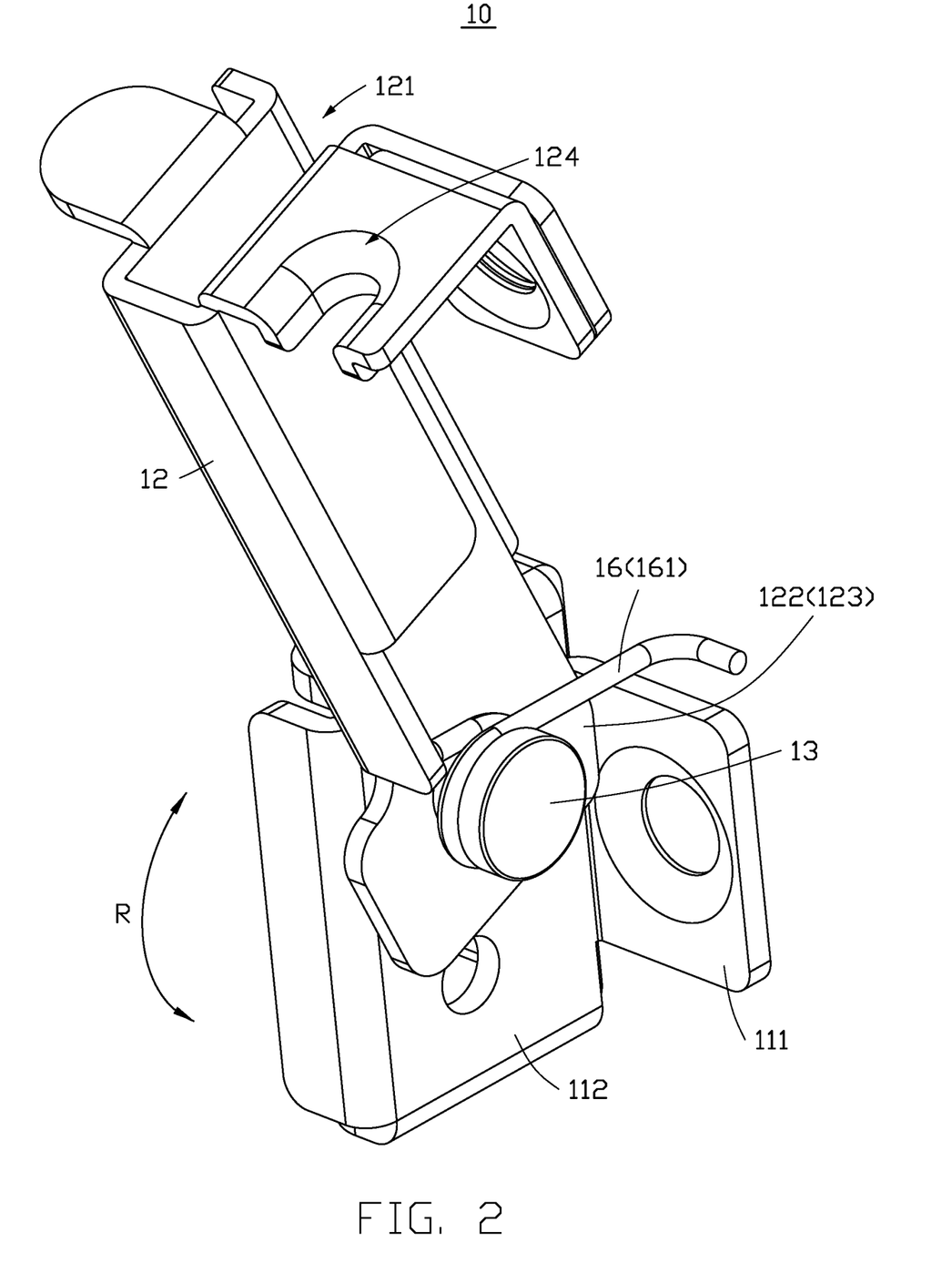
FIG. 2 is a schematic diagram of the locking bracket in an unlocked state according to the first embodiment of the present disclosure.
Figure 3:
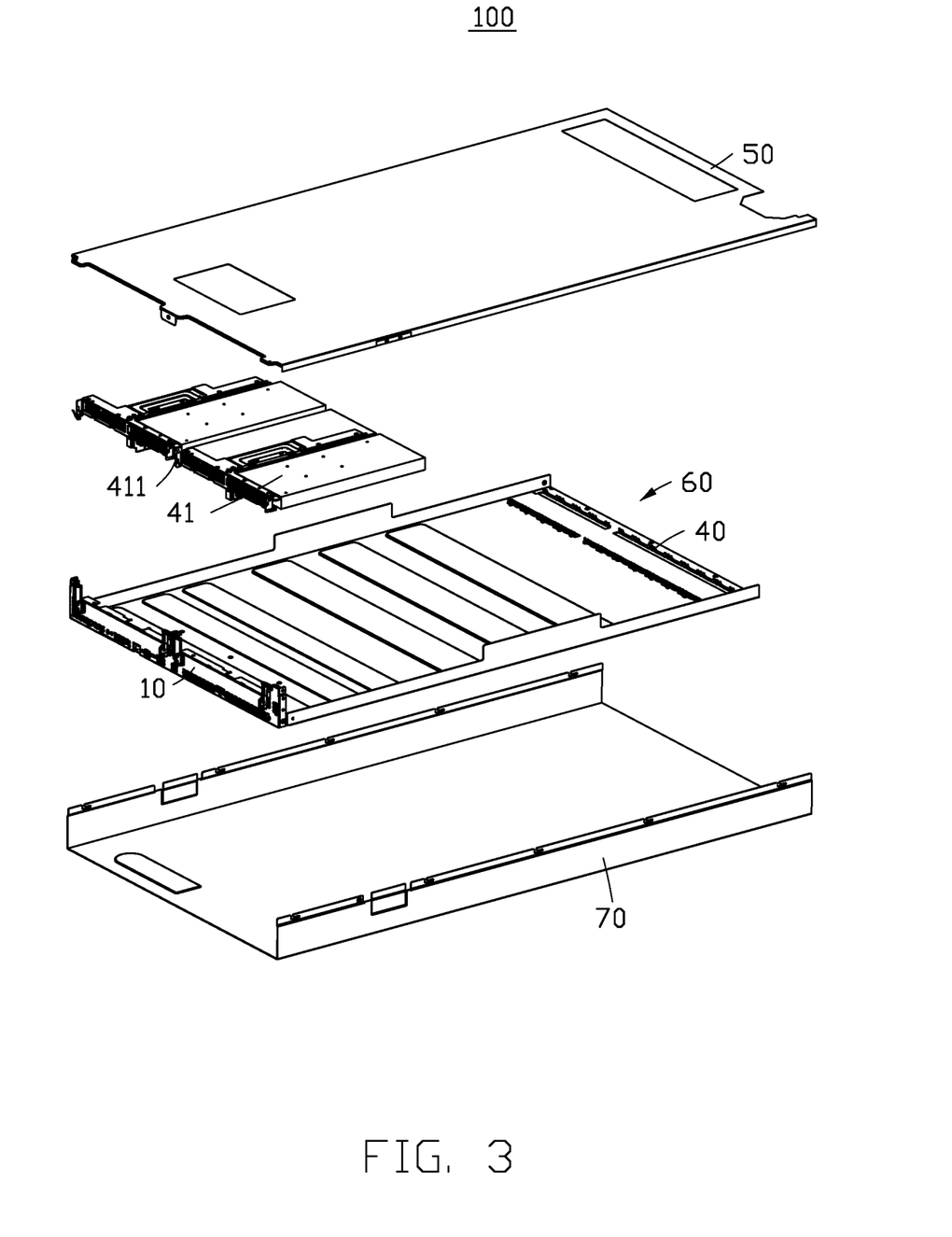
FIG. 3 is an exploded schematic of a chassis according to a second embodiment of the present disclosure.

FIGS. 1 to 3 illustrate a locking bracket 10 in accordance with a first embodiment of the present disclosure.

The locking bracket 10 is used to mount to one side surface of a bottom shell 40 to fix the installing bracket 41 of the chassis 100. The installing bracket 41 wraps around and secures the functional module to fix the position of the functional module, to solve the problem of dislodging components of the functional module due to vibration, shaking, or impact during transportation of the chassis 100. Optionally, the functional module can be a riser module, an interposer module, or a storage module.

The locking bracket 10 includes a locking base 11, a locking block 12, and an articulating column 13. The locking block 12 can be movably connected to the locking base 11 along a preset path. The locking base 11 is hingedly connected to the locking block 12 by the articulating column 13, to enable the locking block 12 to rotate on the locking base 11 and rotate around the articulating column 13. The preset path for the movement of the locking block 12 relative to the locking base 11 is the path for the rotation of the locking block 12 relative to the locking base 11 around the articulating column 13, and the preset path is parallel to the first rotation direction R. The articulating column 13 has a central axis, and the first rotation direction R refers to the direction in which the locking block 12 rotates around the central axis of the articulating column 13.

The locking base 11 includes a fixing portion 111 and an articulating portion 112. The fixing portion 111 is disposed on the side edge of the articulating portion 112, and the fixing portion 111 and the articulating portion 112 are integrally formed through sheet metal bending. The side surface of the fixing portion 111 near the articulating portion 112 is parallel to the central axis of the articulating column 13, and the fixing portion 111 defines a fixing hole 1111 for fixing and connecting the locking base 11 to the side wall of the bottom shell 40 through bolts. The articulating portion 112 is disposed perpendicular to the fixing portion 111, and one end of the locking block 12 is hinged through the articulating column 13, another end of the locking block locking block 12 away from the articulating column 13 is provided with a clamping groove 121, and the clamping groove 121 is used to clamp the limiting portion 411 of the installing bracket 41.

Referring to FIGS. 1 and 3, the locking block 12 has a locked state and an unlocked state, and the locking block 12 is driven to move along a preset path relative to the locking base 11, and the locking block 12 can be switched between the locked state and the unlocked state. When the locking block 12 is in the locked state, the locking block 12 is rotated along a preset path relative to the locking base 11 and proximity to the bottom shell 40, to enable the clamping groove 121 to clamp the limiting portion 411 of the installing bracket 41. When the locking block 12 is in the unlocked state, the locking block 12 is rotated along a preset path relative to the locking base 11 and away from the bottom shell 40, so that the clamping groove 121 can be separated from the limiting portion 411 of the installing bracket 41. The locking block 12 is integrally formed by sheet metal bending, and the clamping groove 121 is formed by bending the locking block 12, thereby reducing the processing cost of the locking block 12 and the locking base 11.

Optionally, a side edge of the locking block 12 is provided with a notch 123, the bottom of the notch 123 is provided with a blocking portion 122, and the blocking portion 122 rotates around a central axis. The distance between the blocking portion 122 and the center axis is greater than the perpendicular distance between the side surface of the fixing portion 111 near the articulating portion 112 and the center axis, to allow the fixing portion 111 to form a block with the blocking portion 122, to limit the angle of rotation of the locking block 12. When the blocking portion 122 of the notch 123 is pressed against the side of the fixing portion 111 near the articulating portion 112, the locking block 12 is at a maximum rotation angle, thereby ameliorating the problem of the locking block 12 rotating at an angle that is too large for the locking block 12 to be easily operated.

Optionally, the locking bracket 10 further includes a retaining member 16, and the retaining member 16 is used for driving the locking block 12 from a locked state to an unlocked state. The retaining member 16 is configured as a torsional spring 161, the torsional spring 161 is mounted on an outer peripheral surface of the articulating column 13, one end of the torsional spring 161 is pressed against the locking block 12, and another end of the torsional spring 161 is pressed against the fixing portion 111. The torsional spring 161 has an elastic force that drives the locking block 12 from the locked state to the unlocked state, and the torsional spring 161 can drive the locking block 12 to rotate to keep the clamping groove 121 away from the bottom shell 40.

Optionally, the end surface of the locking block 12 away from the articulating column 13 is provided with a linkage groove 124, the opening direction of the linkage groove 124 facing away from the opening direction of the clamping groove 121. The specific function of the linkage groove 124 is described in detail in Embodiment 2.

Embodiment 2

Figure 4:
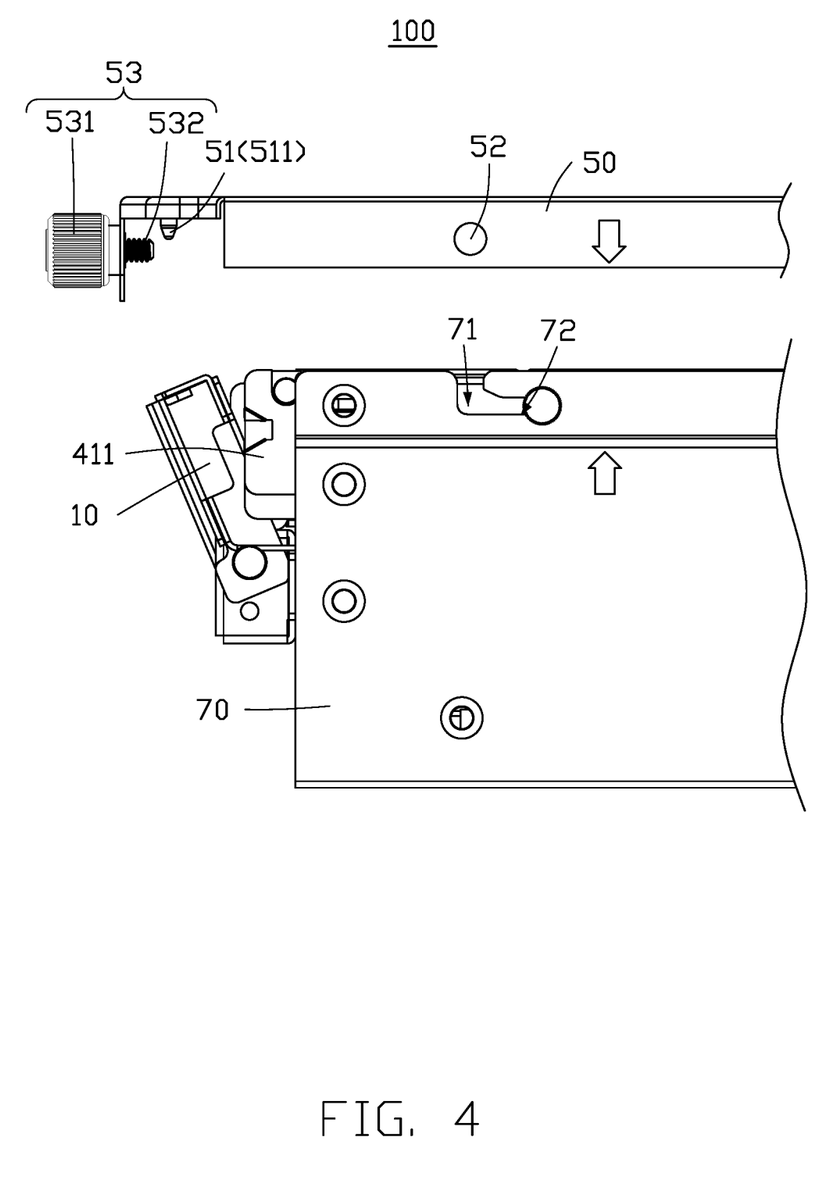
FIG. 4 is a side view of the chassis according to the second embodiment of the present

FIGS. 3 and 4 illustrate a chassis 100 in accordance with a second embodiment of the present disclosure. The chassis 100 includes a bottom shell 40, a top cover 50 and the locking bracket 10 of the first embodiment.

A fixing cavity 60 is formed between the bottom shell 40 and the top cover 50, and the fixing cavity 60 is used for installation the functional module. The functional module is wrapped and fixed through the installing bracket 41. Optionally, the functional module is installed in a direction straight up and down perpendicular to the inner surface of the bottom shell 40.

Optionally, the end surface of the installing bracket 41 is provided with two limiting portions 411, and the sides of the bottom shell 40 are correspondingly provided with two locking bracket 10 to make the limiting of the installing bracket 41 more stable.

Optionally, the end surface of the installing bracket 41 is provided with N limiting portions 411, N is greater than or equal to 3, and the locking bracket 10 provided on the side surface of the bottom shell 40 corresponds to the limiting portion 411, thereby improving the positional stability of the installing bracket 41, X functional modules can be installed simultaneously in each chassis 100, and the number of the locking brackets 10 is correspondingly set to X*N.

Optionally, the locking base 11 can be fixedly connected to the side wall of the bottom shell 40 by means of a fixing bolt, and the locking block 12 can be rotated along a preset path in the locking base 11. The top cover 50 is provided with a linkage member 51, and the linkage member 51 can drive the locking block 12 to move.

Optionally, the linkage member 51 provided by the top cover 50 is a linkage column 511, the linkage column 511 is provided on a side surface of the top cover 50 near the locking block 12. The linkage column 511 is able to enter the linkage groove 124 through an opening in the linkage groove 124, and the linkage groove 124 is used to block the linkage column 511. The top cover 50 has a closed state and an open state. When the top cover 50 is in the open state, the retaining member 16 drives the locking block 12 to rotate along a preset path, the blocking portion 122 of the notch 123 is pressed against the side surface of the fixing portion 111 near the articulating portion 112, the locking block 12 is at the maximum rotation angle, and the locking block 12 is in an unlocked state. The clamping groove 121 can be separated from the limiting portion 411 of the installing bracket 41, so that during the removal of the functional module, the locking bracket 10 will not affect the installing bracket 41 that covers and fixes the functional module. When installing the functional module, the locking bracket 10 has a foolproof design to ensure the correct installation direction of the functional module.

When the top cover 50 is switched from the open state to the closed state, the linkage column 511 drives the locking block 12 to rotate along a preset path so that the clamping groove 121 of the locking block 12 moves toward the bottom shell 40 and is clamped to the limiting portion 411 of the installing bracket 41, and the locking block 12 is in a locked state, thereby enabling the top cover 50 to have the function of closing the cover to clamp the functional module automatically, and without manually operating the locking block 12, the functional module can be directly locked inside the chassis 100, which improves the convenience of the operation and saves the time of operation.

Optionally, the chassis 100 further includes a locking shell 70, the locking shell 70 is fixedly disposed on an outer surface of the bottom shell 40, the bottom shell 40 is used to fix the functional module, and the locking shell 70 is used to cooperate with the top cover 50 for locking and unlocking the top cover 50. The locking shell 70 defines an entry groove 71 and a locking groove 72, and the entry groove 71 and the locking groove 72 are interconnected with each other, the entry groove 71 is parallel to the installation direction for the functional module to be installed in the chassis 100, and the extension direction of the locking groove 72 is away from the locking block 12. The top cover 50 is correspondingly equipped with an installing column 52, and the installing column 52 can slide from the entry groove 71 to the locking groove 72, so that the top cover 50 is connected to the locking shell 70 through the installing column 52.

When the installing column 52 of the top cover 50 is located in the entry groove 71, the retaining member 16 drives the locking block 12 to be in an unlocked state, and the linkage column 511 enters the linkage groove 124 but does not exert any force on the locking block 12. When the installing column 52 of the top cover 50 enters the locking groove 72, due to the extension direction of the locking groove 72 being away from the locking block 12, the top cover 50 moves in the direction of the locking groove 72 to stay away from the locking block 12. Due to the linkage groove 124 blocking the linkage column 511, the linkage column 511 on the top cover 50 overcomes the elasticity of the torsional spring 161, to drive the locking block 12 from the unlocked state to the locked state, so that the functional module can be directly locked inside the chassis 100 without the need for manual operation of the locking block 12. When the installing column 52 of the top cover 50 retracts from the locking groove 72 and enters the entry groove 71, the linkage column 511 does not exert any force on the locking block 12, and the elastic force of the retaining member 16 drives the locking block 12 to switch from a locked state to an unlocked state.

Optionally, the side wall of the top cover 50 is equipped with a tension bolt 53, the tension bolt 53 includes a nut portion 531 and a screw portion 532. The nut portion 531 blocks the top cover 50, and the screw portion 532 can be threaded to the side surface of the bottom shell 40, so that after the installation of the top cover 50 and the locking shell 70 is completed, the top cover 50 can be fixed by tightening the tension bolt 53, thereby facilitating the disassembly and assembly of the top cover 50.

Embodiment 3

Figure 5:
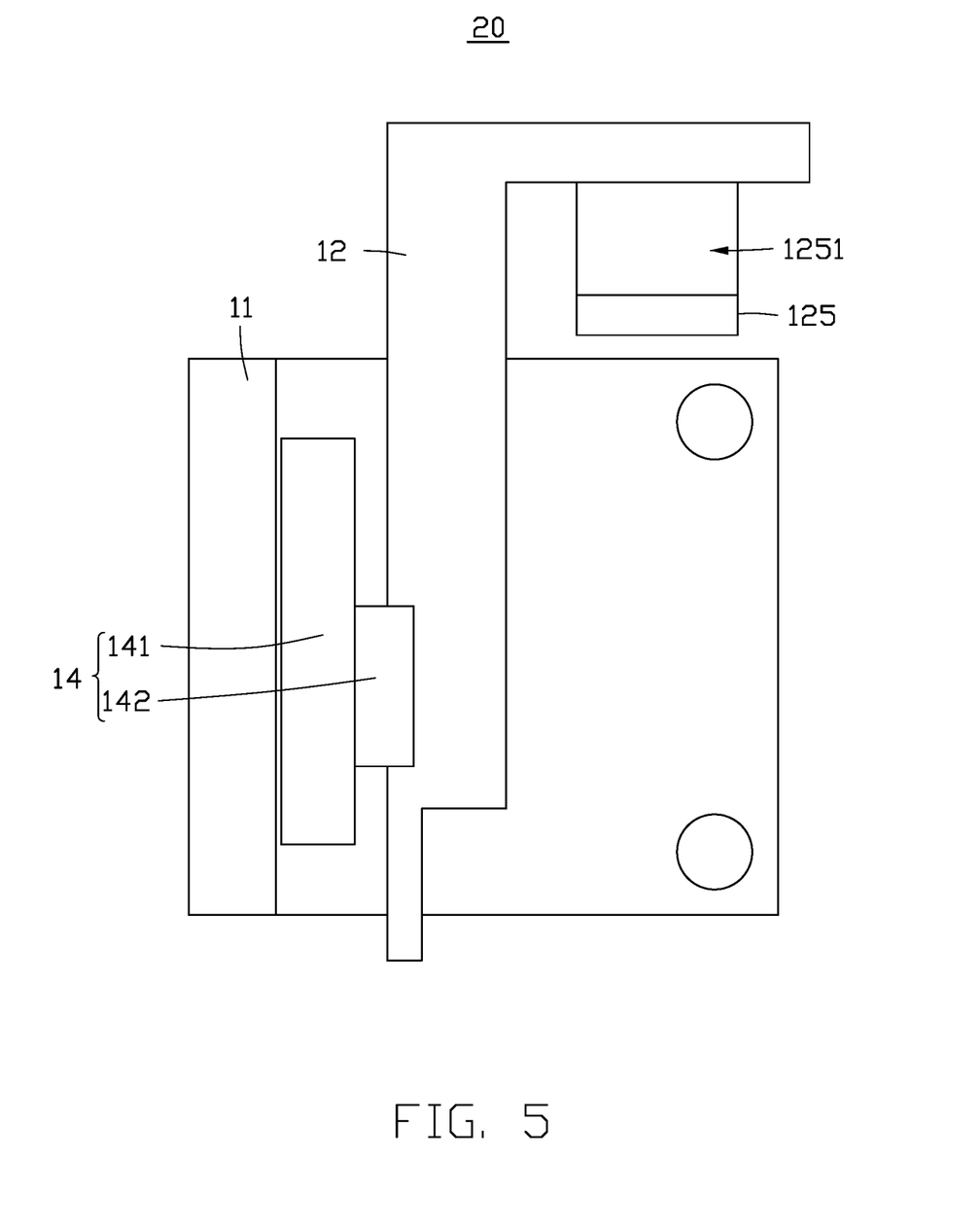
FIG. 5 is a schematic diagram of a locking bracket according to a third embodiment of the present disclosure.

FIG. 5 illustrates a locking bracket 20 in accordance with a third embodiment of the present disclosure. the locking bracket 20 includes a locking base 11, a locking block 12 and a first guide rail 14. The difference from the locking bracket 10 in the first embodiment shown in FIG. 1 is that the preset path of the locking block 12 relative to the locking base 11 is parallel to the second direction Z. The second direction Z is parallel to the installation direction of the functional module installed on the chassis 100.

The first guide rail 14 includes a first track 141 and a first sliding block 142. The first sliding block 142 slides along the length direction of the first track 141 on the first track 141, the first track 141 is fixedly disposed on the side surface of the locking base 11, and the first sliding block 142 is fixedly disposed on the side surface of the locking block 12. The length direction of the first track 141 is configured to be parallel to the installation direction of the functional module installed in the chassis 100.

Optionally, when the locking block 12 slides along the preset path to the lowest end of the first track 141, the locking block 12 is in an unlocked state, and the clamping groove 121 is separated from the limiting portion 411 of the installing bracket 41, so that during the removal of the functional module, the locking bracket 20 will not affect the installing bracket 41 that covers the fixed functional module, thereby improving the problem of uneven disassembly and assembly of the functional module; when the locking block 12 slides along the preset path to the highest end of the first track 141, the locking block 12 is in a locked state, and the clamping groove 121 of the locking block 12 is clamped with the limiting portion 411 of the installing bracket 41, thereby limiting and fixing the installing bracket 41.

Optionally, the locking bracket 20 further includes a retaining member 16, and the retaining member 16 is used for driving the locking block 12 from a locked state to an unlocked state. The retaining member 16 is configured as a tension spring 162, one end of the tension spring 162 is fixed to the bottom end of the locking base 11, and another end of the tension spring 162 is fixed to the bottom end of the locking block 12. The tension spring 162 has the force to drive the downward movement of the locking block 12.

Optionally, the end surface of the locking block 12 away from the articulating column 13 is equipped with a linkage portion 125, the linkage portion 125 has a guiding slope 1251, and the direction of the guiding slope 1251 is away from the bottom shell 40 and facing downwards. The specific function of the linkage portion 125 is described in detail in Embodiment 4.

Embodiment 4

Figure 6:
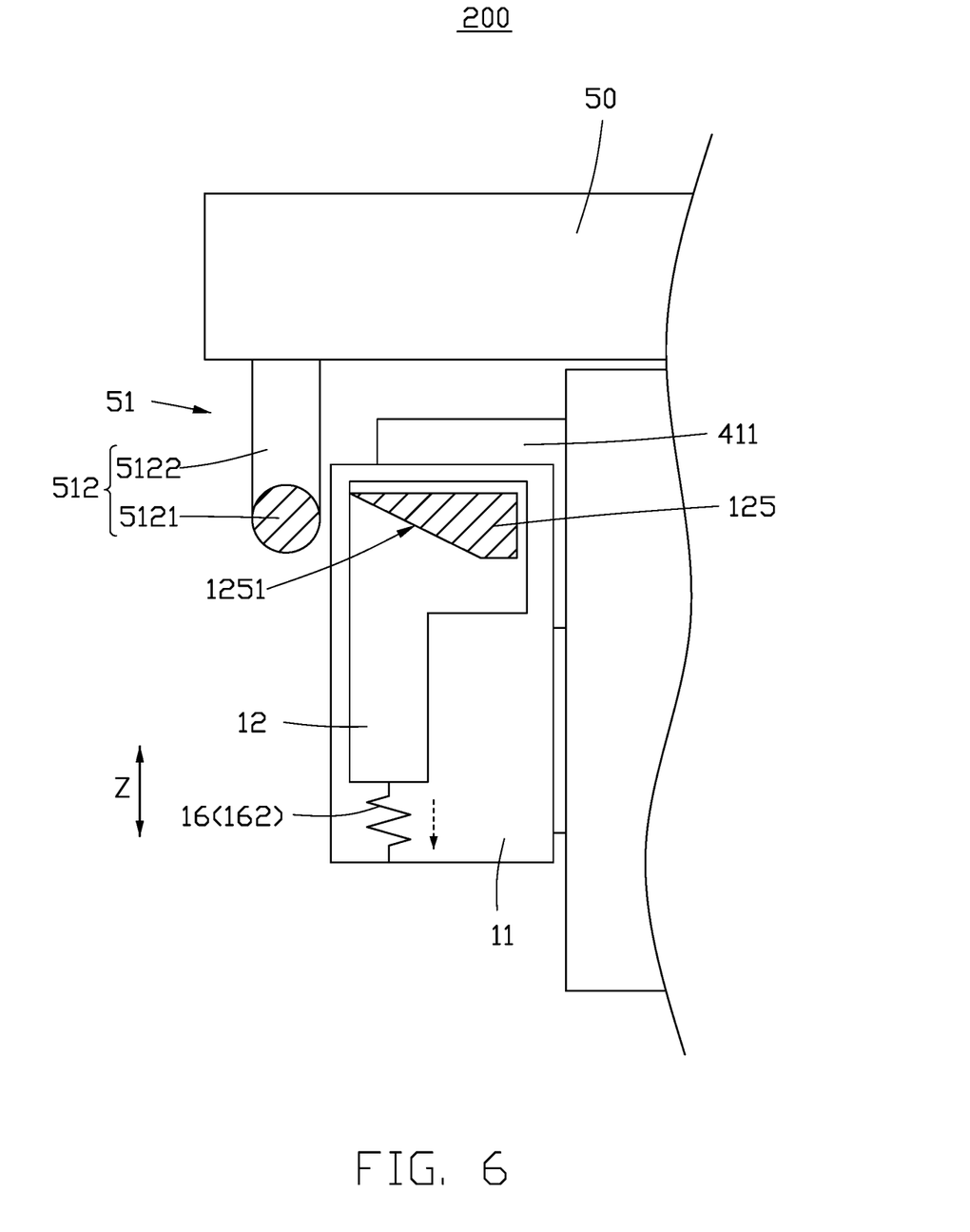
FIG. 6 is a schematic diagram of the locking bracket mating with a top cover according to a fourth embodiment of the present disclosure.

FIG. 6 illustrates a chassis 200 in accordance with a fourth embodiment of the present disclosure. The chassis 200 includes a bottom shell 40, a top cover 50 and the locking bracket 20 of the third embodiment.

The difference from the chassis 100 in the second embodiment shown in FIG. 3 is that the linkage member 51 disposed on the top cover 50 is the linkage rod 512.

The linkage rod 512 includes a driving column 5121 and a connecting rod 5122. The driving column 5121 is horizontally disposed, and the connecting rod 5122 is connected to the locking block 12 and the driving column 5121. The upper surface of the driving column 5121 can be pressed and slid onto the guiding slope 1251 of the linkage portion 125. The present disclosure can drive the linkage portion 125 to move up and down in the vertical direction through the horizontal movement of the linkage rod 512.

When the installing column 52 of the top cover 50 is located in the entry groove 71, the retaining member 16 drives the locking block 12 in an unlocked state, and the driving column 5121 aligns with the highest position of the guiding slope 1251, but does not exert any force on the locking block 12. When the installing column 52 of the top cover 50 enters the locking groove 72, due to the extension direction of the locking groove 72 being away from the locking block 12, the top cover 50 moves in the direction of the locking groove 72 to stay away from the locking block 12. Due to the direction of the guiding slope 1251 being away from the bottom shell 40 and facing downwards, the driving column 5121 slides onto the guiding slope 1251, and the driving column 5121 overcomes the elasticity of the tension spring 162 to drive the locking block 12 to rise, so that the locking block 12 switches from an unlocked state to a locked state, and the functional module can be directly locked inside the chassis 200 without manually operating the locking block 12. When the installing column 52 of the top cover 50 retracts from the locking groove 72 and enters the entry groove 71, the driving column 5121 does not exert any force on the locking block 12. The elastic force of the retaining member 16 drives the locking block 12 to move downwards, and the locking block 12 switches from a locked state to an unlocked state.

Embodiment 5

Figure 7:
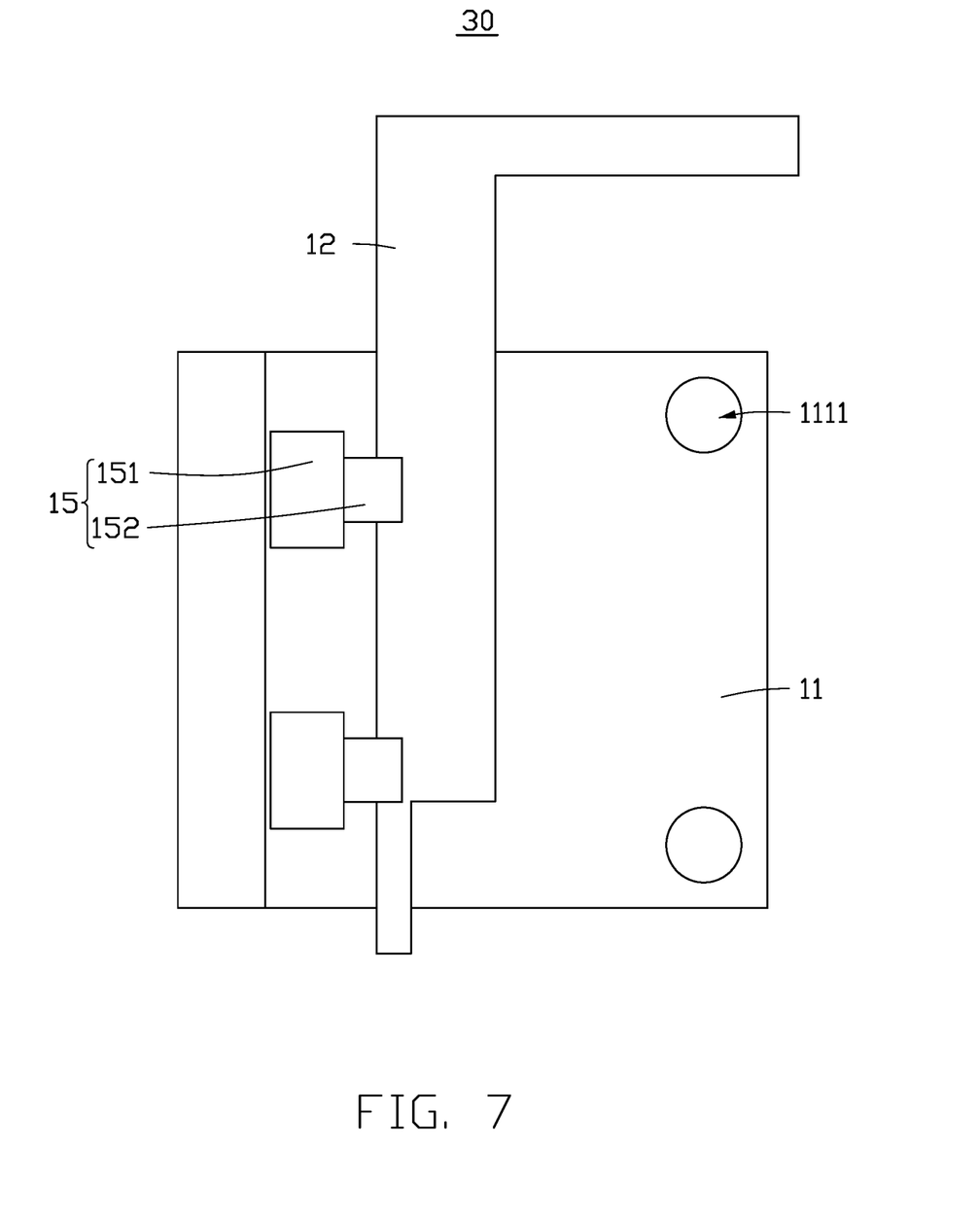
FIG. 7 is a schematic diagram of the locking bracket according to a fifth embodiment of the present disclosure.

FIG. 7 illustrates a locking bracket 30 in accordance with a fifth embodiment of the present disclosure. The locking bracket 30 includes a locking base 11, a locking block 12, and second guide rail 15. The difference from the locking bracket 10 in the first embodiment shown in FIG. 1 is that the preset path of the locking block 12 relative to the locking base 11 is parallel to the third direction Y. The third direction Y is perpendicular to the Z direction in the third embodiment and parallel to the clamping direction of the clamping groove 121, and the clamping direction of the clamping groove 121 facing horizontally towards the bottom shell 40.

The second guide rail 15 includes a second track 151 and a second sliding block 152. The second sliding block 152 slides along the length direction of the second track 151 onto the side surface of the locking base 11, and the second sliding block 152 is fixed on the side surface of the locking block 12.

Optionally, when the locking block 12 slides along the preset path to the end of the second track 151 away from the bottom shell 40, the locking block 12 is in an unlocked state, and the clamping groove 121 is separated from the limiting portion 411 of the installing bracket 41, so that during the removal of the functional module, the locking bracket 30 will not affect the installing bracket 41 that covers and fixes the functional module, thereby improving the problem of uneven disassembly and assembly of the functional module; when the locking block 12 slides along the preset path to one end of the second track 151 near the bottom shell 40, the locking block 12 is in a locked state, and the clamping groove 121 of the locking block 12 is clamped with the limiting portion 411 of the installing bracket 41, thereby limiting and fixing the installing bracket 41.

Optionally, the locking bracket 30 further includes a retaining member 16, and the retaining member 16 is used for driving the locking block 12 from a locked state to an unlocked state. The retaining member 16 is configured as a compression spring 163, one end of the compression spring 163 is fixed to the locking base 11 and another end of the compression spring 163 is fixed to the locking block 12. The compression spring 163 has the force to drive the locking block 12 to move away from the bottom shell 40.

Embodiment 6

Figure 8:
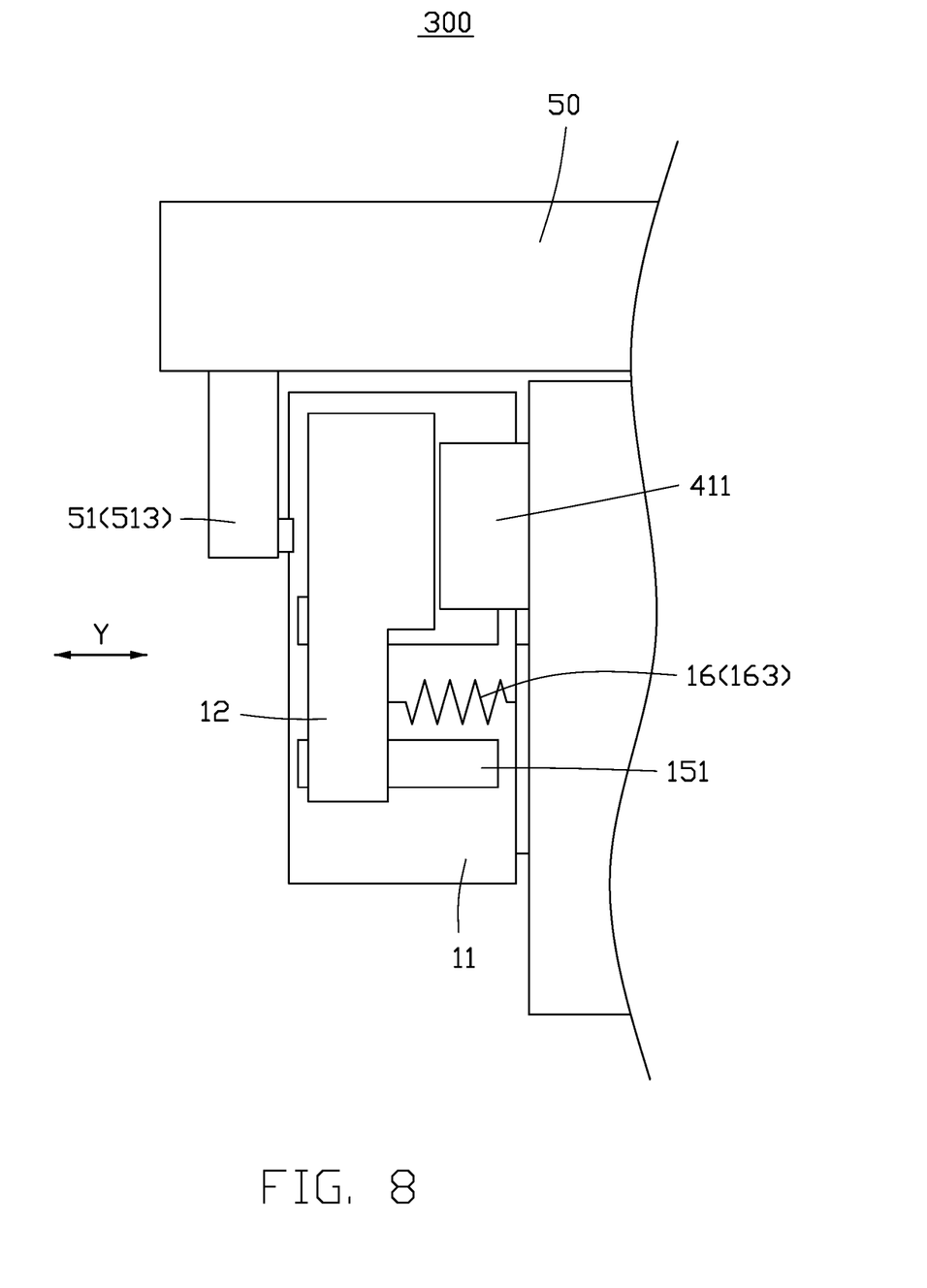
FIG. 8 is a schematic diagram of the locking bracket mating with the top cover according to a sixth embodiment of the present disclosure.

FIG. 8 illustrates a chassis 300 in accordance with a sixth embodiment of the present disclosure. The chassis 300 includes a bottom shell 40, a top cover 50 and a locking bracket 30 of the fifth embodiment. The difference from the chassis 100 in the second embodiment shown in FIG. 3 is that the linkage member 51 disposed on the top cover 50 is the linkage push plate 513.

The linkage push plate 513 is installed on the lower surface of the top cover 50. The side surface of the linkage push plate 513 can compress and push the locking block 12 towards the bottom shell 40, so that the clamping groove 121 on the locking block 12 moves towards the limiting portion 411 of the installing bracket 41, and the installing bracket 41 is clamped tightly.

When the installing column 52 of the top cover 50 is located in the entry groove 71, the retaining member 16 drives the locking block 12 to be in an unlocked state, and the linkage push plate 513 is close to the side surface of the locking block 12, but does not exert any force on the locking block 12. When the installing column 52 of the top cover 50 enters the locking groove 72, due to the extension direction of the locking groove 72 being away from the locking block 12, the top cover 50 moves in the direction of the locking groove 72 to stay away from the locking block 12. The linkage push plate 513 pushes the locking block 12 to overcome the elasticity of the compression spring 163 and drive the locking block 12 to move towards the bottom shell 40, so as to switch the locking block 12 from the unlocked state to the locked state, so that the functional module can be directly locked inside the chassis 300 without the need for manual operation of the locking block 12. When the installing column 52 of the top cover 50 retracts from the locking groove 72 and enters the entry groove 71, the linkage push plate 513 does not generate thrust on the locking block 12. The elastic force of the retaining member 16 drives the locking block 12 away from the bottom plate, and the locking block 12 switches from the locked state to the unlocked state.

In the above embodiment, the third direction Y is the direction in which the locking block 12 slides along the length direction of the second guide rail 15. The length direction of the second guide rail 15 is perpendicular to the installation direction for installing the functional module on the chassis 300 and parallel to the clamping direction of the clamping groove 121. When the locking block 12 is in a locked state, the clamping groove 121 of the locking block 12 is clamped with the limiting portion 411 of the installing bracket 41, thereby limiting and fixing the installing bracket 41. When the locking block 12 is in the unlocked state, the locking block 12 slides along the third direction Y onto the locking base 11 to separate the clamping groove 121 from the limiting portion 411 of the installing bracket 41, so that during the process of removing the functional module, the locking bracket 10 will not affect the installing bracket 41 that covers and fixes the functional module, thereby improving the problem of uneven disassembly and assembly of the functional module.

Based on the first embodiment, the third embodiment, and the fifth embodiment, it can be understood that the preset path for the movement of the locking block 12 relative to the locking base 11 is also formed by any two or three combinations of the first rotation direction R, the second direction Z, and the third direction Y. The present disclosure involves moving the locking block 12 relative to the locking base 11 along a preset path, allowing the locking block 12 to transition between the locked state and unlocked state.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. A locking bracket comprising:
   a locking block;
   a locking base fixedly connected to a chassis to limit movement of a functional module relative to the chassis through the locking block,
   wherein the locking block is flexibly connected to the locking base along a preset path, and the locking block defines a clamping groove, and the clamping groove is configured for clamping a limiting portion of an installing bracket, and
   the locking block moves along the preset path relative to the locking base to change between a locked state and an unlocked state, when the locking block is in the locked state, the clamping groove clamps the limiting portion of the installing bracket, when the locking block is in the unlocked state, the clamping groove detaches from the limiting portion of the installing bracket.

2. The locking bracket according to claim 1, further comprising an articulating column, wherein one end of the locking block away from the clamping groove is hinged with the locking base through the articulating column, so that the locking block moves along the preset path relative to the locking base in a first rotation direction, and when the locking block is in the unlocked state, the locking block rotates along the preset path to enable the clamping groove to detach from the limiting portion of the installing bracket.

3. The locking bracket according to claim 2, wherein the locking block is equipped with a blocking portion, the articulating column has a central axis, the blocking portion rotates around the central axis, the locking base comprises a fixing portion, and the fixing portion forms a block with the blocking portion to limit a rotation angle of the locking block.

4. The locking bracket according to claim 3, wherein the locking base further comprises an articulating portion, the fixing portion is disposed on a side edge of the articulating portion, the locking block is hinged with the articulating portion, and a side surface of the fixing portion near the articulating portion is parallel to the central axis, a side edge of the locking block defines a notch, and the blocking portion is located at the notch, a distance between the blocking portion and the central axis is greater than a vertical distance between the side surface of the fixing portion near the articulating portion and the central axis.

5. The locking bracket according to claim 1, wherein the locking block and the locking base are configured as bent sheet metal materials, and the locking block is bent to form a clamping groove.

6. The locking bracket according to claim 1, further comprising a first guide rail, wherein the first guide rail extends in a second direction, and the second direction is an installation direction of the functional module installed on the chassis, the locking block is slidably disposed on the locking base through the first guide rail, and the preset path is parallel to the second direction, and when the locking block is in the unlocked state, the locking block slides along the preset path onto the locking base to enable the clamping groove to detach from the limiting portion of the installing bracket.

7. The locking bracket according to claim 1, further comprising a second guide rail, wherein the second guide rail extends in a third direction perpendicular to an installation direction of the functional module installed on the chassis, the locking block is slidably disposed on the locking base through the second guide rail, and the preset path is parallel to the third direction, and when the locking block is in the unlocked state, the locking block slides along the preset path onto the locking base to enable the clamping groove to detach from the limiting portion of the installing bracket.

8. A chassis comprising:
a bottom shell;
a top cover, wherein a fixing cavity is formed between the bottom shell and the top cover, and
the fixed cavity is configured for installing a functional module; and
a locking bracket comprising:
a locking block;
a retaining member; and
a locking base fixedly connected to a chassis to limit movement of a functional module relative to the chassis through the locking block,
wherein the locking base is fixedly connected to a side wall of the bottom shell,
the locking block is flexibly connected to the locking base along a preset path, and the locking block defines a clamping groove, and the clamping groove is configured for clamping a limiting portion of an installing bracket,
the locking block moves along the preset path relative to the locking base to change between a locked state and an unlocked state, when the locking block is in the locked state, the clamping groove clamps the limiting portion of the installing bracket, when the locking block is in the unlocked state, the clamping groove detaches from the limiting portion of the installing bracket,
the retaining member is configured for driving the locking block from the locked state to the unlocked state, and
the top cover has a closed state and an open state, and the top cover is equipped with a linkage member, when the top cover is in the open state, the retaining member drives the locking block to be in the unlocked state, and when the top cover is in the closed state, the linkage member drives the locking block to be in the locked state.

9. The chassis according to claim 8, wherein the locking bracket further comprises an articulating column, and one end of the locking block away from the clamping groove is hinged with the locking base through the articulating column, so that the locking block moves along the preset path relative to the locking base in a first rotation direction, and when the locking block is in the unlocked state, the locking block rotates along the preset path to enable the clamping groove to detach from the limiting portion of the installing bracket.

10. The chassis according to claim 9, wherein the locking block is equipped with a blocking portion, the articulating column has a central axis, the blocking portion rotates around the central axis, the locking base comprises a fixing portion, and the fixing portion forms a block with the blocking portion to limit a rotation angle of the locking block.

11. The chassis according to claim 10, wherein the locking base further comprises an articulating portion, the fixing portion is disposed on a side edge of the articulating portion, the locking block is hinged with the articulating portion, and a side surface of the fixing portion near the articulating portion is parallel to the central axis; a side edge of the locking block defines a notch, and the blocking portion is located at the notch, a distance between the blocking portion and the central axis is greater than a vertical distance between the side surface of the fixing portion near the articulating portion and the central axis.

12. The chassis according to claim 8, wherein the locking block and the locking base are configured as bent sheet metal materials, and the locking block is bent to form a clamping groove.

13. The chassis according to claim 8, wherein the locking bracket further comprises a first guide rail, the first guide rail extends in a second direction, and the second direction is an installation direction of the functional module installed on the chassis; the locking block is slidably disposed on the locking base through the first guide rail, and the preset path is parallel to the second direction; when the locking block is in the unlocked state, the locking block slides along the preset path onto the locking base to enable the clamping groove to detach from the limiting portion of the installing bracket.

14. The chassis according to claim 8, wherein the locking bracket further comprises a second guide rail, the second guide rail extends in a third direction perpendicular to the installation direction of the functional module installed on the chassis; the locking block is slidably disposed on the locking base through the second guide rail, and the preset path is parallel to the third direction; and when the locking block is in the unlocked state, the locking block slides along the preset path onto the locking base to enable the clamping groove to detach from the limiting portion of the installing bracket.

15. A chassis comprising:
a bottom shell;
a top cover, wherein a fixing cavity is formed between the bottom shell and the top cover, and
the fixed cavity is configured for installing a functional module; and
a locking bracket comprising:
a locking block;
a retaining member; and
a locking base fixedly connected to a chassis to limit movement of a functional module relative to the chassis through the locking block; wherein the locking base is fixedly connected to a side wall of the bottom shell;
wherein the locking block is flexibly connected to the locking base along a preset path, and the locking block defines a clamping groove, and the clamping groove is configured for clamping a limiting portion of an installing bracket,
the locking block moves along the preset path relative to the locking base to change between a locked state and an unlocked state, when the locking block is in the locked state, the clamping groove clamps the limiting portion of the installing bracket; when the locking block is in the unlocked state, the clamping groove detaches from the limiting portion of the installing bracket,
the retaining member is configured for driving the locking block from the locked state to the unlocked state;

the top cover has a closed state and an open state, and the top cover is equipped with a linkage member, when the top cover is in the open state, the retaining member drives the locking block to be in the unlocked state; and when the top cover is in the closed state, the linkage member drives the locking block to be in the locked state;
the retaining member is configured as a torsion spring, the torsion spring is installed on an outer surface of an articulating column of the locking bracket to drive the locking block from the locked state to the unlocked state, and
a side surface of the top cover close to the locking block is equipped with a linkage column, and an end surface of the locking block away from the articulating column defines a linkage groove, the linkage groove is configured to block the linkage column, and the linkage column drives the locking block to switch from the unlocked state to the locked state.

16. The chassis according to claim 15, wherein one end of the locking block away from the clamping groove is hinged with the locking base through the articulating column, so that the locking block moves along the preset path relative to the locking base in a first rotation direction; when the locking block is in the unlocked state, the locking block rotates along the preset path to enable the clamping groove to detach from the limiting portion of the installing bracket.

17. The chassis according to claim 16, wherein the locking block is equipped with a blocking portion, the articulating column has a central axis, the blocking portion rotates around the central axis, the locking base comprises a fixing portion, and the fixing portion forms a block with the blocking portion to limit rotation angle of the locking block.

18. The chassis according to claim 17, wherein the locking base further comprises an articulating portion, the fixing portion is disposed on a side edge of the articulating portion, the locking block is hinged with the articulating portion, and a side surface near the articulating portion is parallel to the central axis; a side edge of the locking block defines a notch, and the blocking portion is located at the notch, a distance between the blocking portion and the central axis is greater than a vertical distance between the side surface of the fixing portion near the articulating portion and the central axis.

* * * * *